(12) United States Patent
Segervall et al.

(10) Patent No.: US 7,187,212 B1
(45) Date of Patent: Mar. 6, 2007

(54) SYSTEM AND METHOD FOR PROVIDING A FAST TURN ON BIAS CIRCUIT FOR CURRENT MODE LOGIC TRANSMITTERS

(75) Inventors: Alan E. Segervall, Half Moon Bay, CA (US); Laurence D. Lewicki, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 117 days.

(21) Appl. No.: 10/973,220

(22) Filed: Oct. 26, 2004

(51) Int. Cl.
*H03K 19/20* (2006.01)
*H03K 19/086* (2006.01)
*H03K 19/094* (2006.01)
*H03K 19/003* (2006.01)

(52) U.S. Cl. .................... 326/127; 326/31; 326/33; 326/115; 326/126

(58) Field of Classification Search ............. 326/115, 326/126, 127
See application file for complete search history.

(56) References Cited

U.S. PATENT DOCUMENTS

| | | | | |
|---|---|---|---|---|
| 5,587,945 A | * | 12/1996 | Lin et al. .................. | 365/185.1 |
| 5,909,127 A | * | 6/1999 | Pearson et al. ............. | 326/115 |
| 6,028,789 A | * | 2/2000 | Mehta et al. ........... | 365/185.14 |
| 6,642,791 B1 | * | 11/2003 | Balan ......................... | 330/253 |
| 6,909,309 B2 | * | 6/2005 | Green ......................... | 326/115 |
| 2004/0041593 A1 | * | 3/2004 | Lai ............................. | 326/115 |
| 2004/0100307 A1 | * | 5/2004 | Wong et al. ................. | 326/115 |
| 2004/0246026 A1 | * | 12/2004 | Wang et al. .................. | 326/86 |
| 2005/0264336 A1 | * | 12/2005 | Kang ......................... | 327/287 |
| 2005/0264344 A1 | * | 12/2005 | Kim et al. ................... | 327/538 |

* cited by examiner

*Primary Examiner*—Vibol Tan
*Assistant Examiner*—Dylan White

(57) ABSTRACT

A system and method is disclosed for providing a fast turn on bias circuit that permits a fast transition from an idle "power down" state to an active "power up" state in current mode logic (CML) transmitter output circuits. The invention comprises a capacitor coupled to a bias transistor and a charge switch circuit for controlling the operation of the capacitor. The capacitor has a value of capacitance that is equal in magnitude and opposite in sign to the Miller coupling capacitance in the bias transistor. The capacitor compensates for the Miller coupling capacitance within the bias transistor in less than ten nanoseconds. This permits a CML transmitter to more quickly restart the transmission of data after an active state has been initiated.

24 Claims, 5 Drawing Sheets

US 7,187,212 B1

SYSTEM AND METHOD FOR PROVIDING A FAST TURN ON BIAS CIRCUIT FOR CURRENT MODE LOGIC TRANSMITTERS

TECHNICAL FIELD OF THE INVENTION

The present invention is generally directed to the manufacture of semiconductor devices and, in particular, to a system and method for providing a fast turn on bias circuit for current mode logic (CML) transmitters used in power managed applications.

BACKGROUND OF THE INVENTION

Current mode logic (CML) transmitters are often used in power managed applications. In order to conserve power it is sometimes necessary to turn off the outputs of a CML transmitter. The outputs of a CML transmitter output circuit are turned off by logically driving low the differential CML output gates. When the outputs of the CML transmitter output circuit are switched off, the drain of the bias transistor of the CML transmitter output circuit pulls low.

Then, when the CML transmitter output circuit is subsequently turned back on, the differential outputs of the CML transmitter output circuit are enabled. This causes the drain of the bias transistor of the CML transmitter output circuit to be rapidly pulled up. The Miller coupling capacitance from the drain to the gate of the bias transistor of the CML transmitter output circuit causes the bias voltage to increase. This increase in turn causes the output levels of the CML transmitter output circuit to be too large (i.e., having values that are out of specification) for a period of time that is longer than the time allowed for an "idle to active" transition.

That is, the active state transition (from "idle to active") disturbs the reference bias circuit voltage in a manner that causes the reference bias circuit voltage to take too long (e.g., one hundred fifty nanoseconds (150 nsec)) to settle down to its steady state value.

Therefore, there is a need in the art for a system and method for providing a bias circuit that permits a fast transition from an idle state (i.e., power down state) to an active state (i.e., power up state) in current mode logic (CML) transmitter output circuits.

SUMMARY OF THE INVENTION

To address the above-discussed deficiencies of the prior art, it is a primary object of the present invention to provide a system and method for providing a fast turn on bias circuit that permits a fast transition from an idle "power down" state to an active "power up" state in current mode logic (CML) transmitter output circuits.

In one advantageous embodiment the fast turn on bias circuit of the invention comprises a capacitor and a charge switch circuit for controlling the operation of the capacitor. The capacitor is coupled to a bias transistor of a current mode logic (CML) transmitter output circuit. The capacitor has a value of capacitance that is equal in magnitude and opposite in sign to the Miller coupling capacitance in the bias transistor.

When the voltage of the drain node of the bias transistor increases (i.e., goes to a logical high), the charge switch circuit receives a control signal that causes it to enable the operation of the capacitor of the fast turn on bias circuit. The capacitor then compensates for the Miller coupling capacitance within the bias transistor by providing a compensating value of capacitance to the gate of the bias transistor.

The capacitor compensates for the Miller coupling capacitance in less than ten nanoseconds. This permits the common mode logic (CML) transmitter output circuit to more quickly restart the transmission of data after an active state has been initiated.

In an alternate advantageous embodiment of the invention a plurality of capacitors is provided in the fast turn on bias circuit. In response to the receipt of control signals the fast turn on bias circuit switches in a first portion of the plurality of capacitors and switches out a second portion of the plurality of capacitors. In this manner different values of capacitance may be generated to compensate for different values of the Miller coupling capacitance in the bias transistor of a current mode logic (CML) transmitter output circuit.

It is an object of the present invention to provide a system and method for providing a fast turn on bias circuit.

It is also an object of the present invention to provide a system and method for providing a fast turn on bias circuit for current mode logic (CML) transmitter output circuits.

It is yet another object of the present invention to provide a system and method for compensating for Miller coupling capacitance in a bias transistor circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
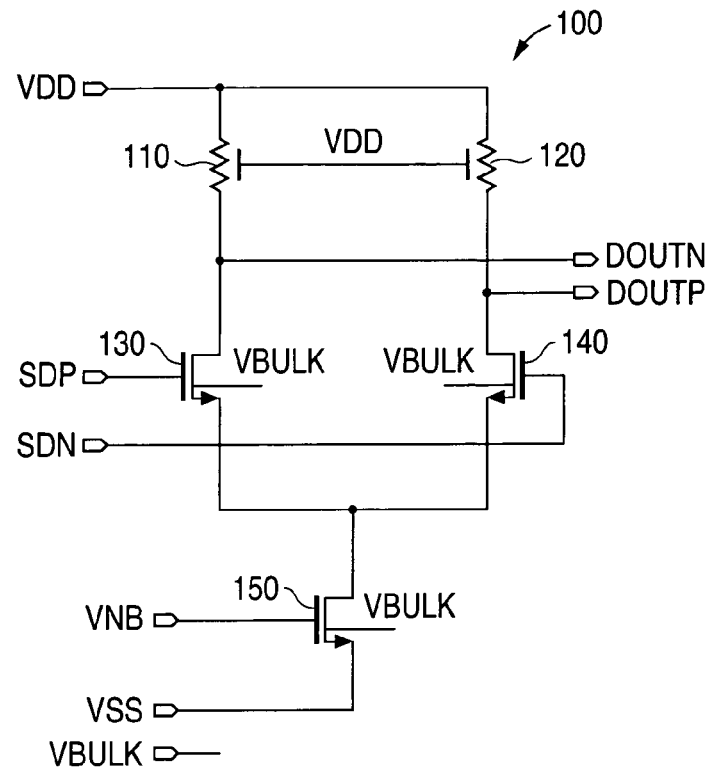
FIG. 1 illustrates a schematic diagram of a prior art current mode logic (CML) output circuit.

FIGS. 1 through 6 and the various embodiments used to describe the principles of the present invention in this patent document are by way of illustration only and should not be construed in any way to limit the scope of the invention. Those skilled in the art will understand that the principles of the present invention may be implemented in any type of suitably arranged current mode logic (CML) circuit.

To simplify the drawings the reference numerals from previous drawings will sometimes not be repeated for structures that have already been identified.

In order to better understand the principles of the present invention a description of a prior art current mode logic (CML) transmitter output circuit will first be given. FIG. 1 illustrates a schematic diagram of a prior art current mode logic (CML) transmitter output circuit 100. The current mode logic (CML) transmitter circuit 100 comprises resistor 110, resistor 120, transistor 130, transistor 140 and transistor 150 coupled together as shown in FIG. 1. Supply voltage VDD is provided to resistor 110 and to resistor 120. The drain of transistor 130 is coupled to resistor 110 and to the output node DOUTN. The drain of transistor 140 is coupled to resistor 120 and to the output node DOUTP.

The gate of transistor 130 is coupled to a first input signal SDP. The gate of transistor 140 is coupled to a second input signal SDN. The source of transistor 130 and the source of transistor 140 are each coupled to the drain of bias transistor 150. The source of bias transistor 150 is coupled to the ground voltage VSS. The gate of bias transistor 150 is coupled to a bias control voltage signal VNB.

The outputs of circuit 100 are turned off by logically driving the gates of transistor 130 and transistor 140 low. When the outputs (DOUTN and DOUTP) of circuit 100 are switched off, then the drain of the bias transistor 150 of circuit 100 pulls low.

Then, when circuit 100 is subsequently turned back on, the differential outputs (DOUTN and DOUTP) of circuit 100 are enabled. That is, the differential outputs (DOUTN and DOUTP) of circuit 100 are turned on by logically driving the gates of transistor 130 and transistor 140 high. This causes the drain of the bias transistor 150 to be rapidly pulled up.

The Miller coupling capacitance from the drain to the gate of the bias transistor 150 causes the bias voltage to increase. This increase in turn causes the output levels of circuit 100 to be too large (i.e., having values that are out of specification) for a period of time that is longer than the time allowed for an "idle to active" transition.

That is, the active state transition (from "idle to active") disturbs the reference bias circuit voltage of transistor 150 in a manner that causes the reference bias circuit voltage to take too long (e.g., one hundred fifty nanoseconds (150 nsec)) to settle down to its steady state value.

Figure 2:
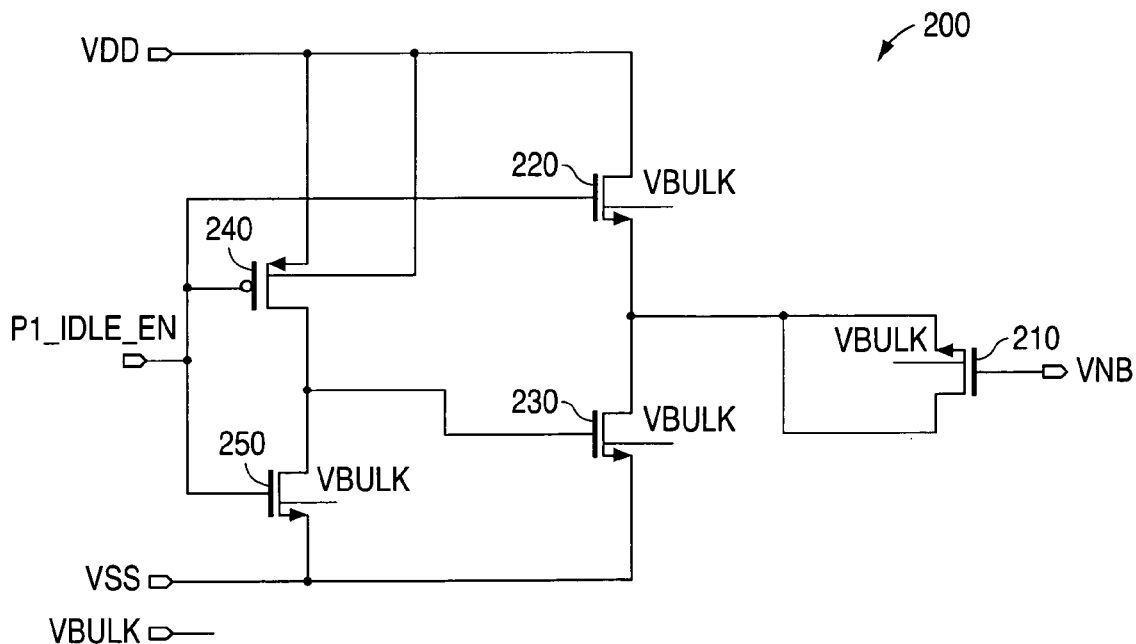
FIG. 2 illustrates a schematic diagram of an advantageous embodiment of a fast turn on bias circuit of the present invention for use with a current mode logic (CML) transmitter output circuit.

An advantageous embodiment of the fast turn on bias circuit 200 of the present invention is shown in FIG. 2. In order to compensate for the Miller coupling capacitance across the bias transistor 150 of circuit 100, the fast turn on bias circuit 200 uses a capacitor 210 of an appropriate size. Capacitor 210 comprises transistor 210 configured as a capacitor. The output of capacitor 210 (from the gate of transistor 210) is provided to the gate of transistor 150 of FIG. 1 as the bias control voltage VNB. Capacitor 210 may also be referred to as a charge compensation capacitor 210.

Fast turn on bias circuit 200 comprises transistor 210 (configured as capacitor 210), transistor 220, transistor 230, transistor 240, and transistor 250 coupled together as shown in FIG. 2. Transistor 220, transistor 230, transistor 240, and transistor 250 are elements of a switching device that is controlled an enable signal P1_IDLE_EN. The switching device may be referred to as a charge switch circuit. The enable signal P1_IDLE_EN is coupled to the gate of transistor 220, to the gate of transistor 240, and to the gate of transistor 250.

Supply voltage VDD is coupled to the drain of transistor 220 and to the source of transistor 240. Ground voltage VSS is coupled to the source of transistor 230 and to the source of transistor 250. The drain of transistor 240 and the drain of transistor 250 are coupled together and are also coupled to the gate of transistor 230.

As previously mentioned, the output of fast turn on bias circuit 200 is the bias control voltage VNB. The bias control voltage VNB is provided to the gate of bias transistor 150 of circuit 100. When a disable signal (i.e., a "low" signal) is sent to the SDP and SDN inputs of circuit 100 then the differential outputs (DOUTN and DOUTP) of circuit 100 are switched "off" and placed in an idle state. The bias control voltage VNB is kept at its normal reference level. Therefore, the drain of transistor 150 is pulled "low" during an idle state.

When circuit 100 is switched "on" and placed in an active state, an enable signal (i.e., a "high" signal) is sent to the SDP and SDN inputs of control circuit 100. Current begins to flow from the supply voltage VDD down through transistor 130 and transistor 140 and rapidly charges up the drain node of bias transistor 150. This is when the Miller coupling capacitance from the drain to the gate of the bias transistor 150 (sometimes designated Cgd) pulls the bias voltage node VNB up. This in turn causes more current to flow through bias transistor 150. This causes larger output levels than desired at the differential outputs (DOUTN and DOUTP).

The fast turn on bias circuit 200 of the present invention compensates for this effect by switching an equivalent amount of Miller coupling capacitance in the opposite direction. This opposite amount of Miller coupling capacitance eliminates the undesired effect on the bias control voltage VNB. When an enable signal (i.e., a "high" signal) is sent to the SDP and SDN inputs of control circuit 100, a disable signal (i.e., a "low" signal) is also simultaneously sent to the P1_IDLE_EN input node of fast turn on bias circuit 200. Conventional circuitry is used to send an enable signal to the P1_IDLE_EN input node. The circuitry that is used to send an enable signal to the P1_IDLE_EN node of fast turn on bias circuit 200 is not shown in FIG. 1 or in FIG. 2.

When an enable signal (i.e., a "high" signal) is sent to the P1_IDLE_EN input node of the fast turn on bias circuit 200 the enable signal is also sent to the gate of transistor 220. This enables the operation of transistor 220. The inverter circuit formed by transistor 240 and transistor 250 sends an inverted value of the enable signal (i.e., a "low" signal) to the gate of transistor 230. This disables the operation of transistor 230. In this manner, the enable signal that is sent to the P1_IDLE_EN input node enables the operation of charge compensation capacitor 210.

Conversely, when a disable signal (i.e., a "low" signal) is sent to the P1_IDLE_EN input node of the fast turn on bias circuit 200 the disable signal is also sent to the gate of transistor 220. This disables the operation of transistor 220. The inverter circuit formed by transistor 240 and transistor 250 sends an inverted value of the disable signal (i.e., a "high" signal) to the gate of transistor 230. This enables the operation of transistor 230. In this manner, the disable signal that is sent to the P1_IDLE_EN input node disables the operation of charge compensation capacitor 210.

FIGS. 3A through 3D illustrates four timing diagrams that illustrate the active/idle state transition effects on the bias control voltage VNB of current mode logic (CML) transmitter output circuit 100 and how the fast turn on bias circuit 200 cancels the Miller capacitance coupling effect. The four timing diagrams are from a computer simulation of the operation of current mode logic (CML) transmitter output circuit 100 and fast turn on bias circuit 200.

Figure 3A:
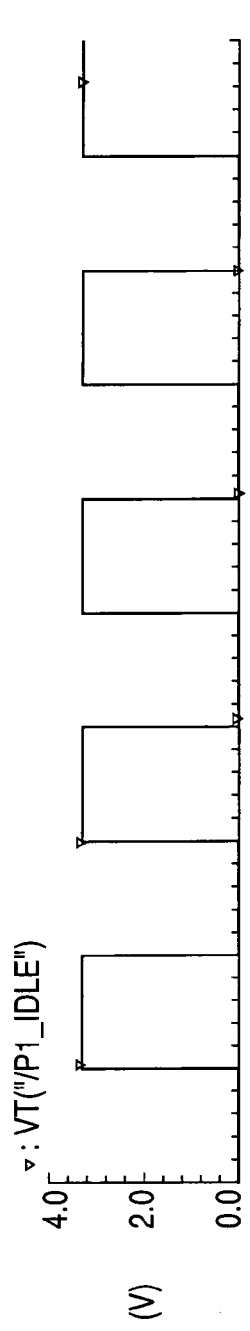
FIGS. 3A through 3D illustrates four timing diagrams that illustrate the active/idle state transition effects on the bias control voltage of a current mode logic (CML) transmitter output circuit and how the fast turn on bias circuit of the present invention cancels the Miller capacitance coupling effect.
Figure 3B:
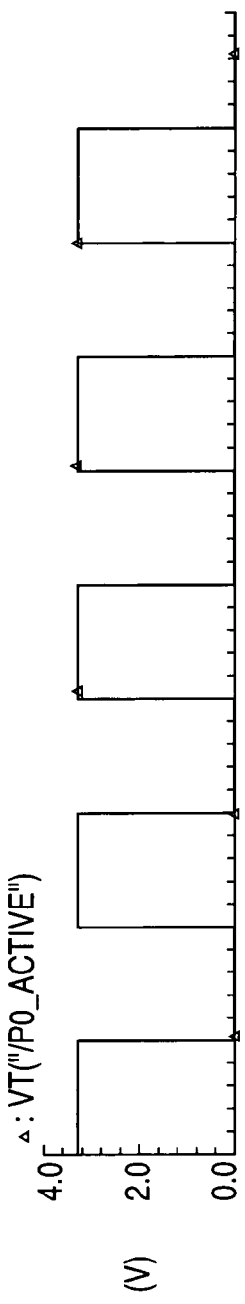
Figure 3C:
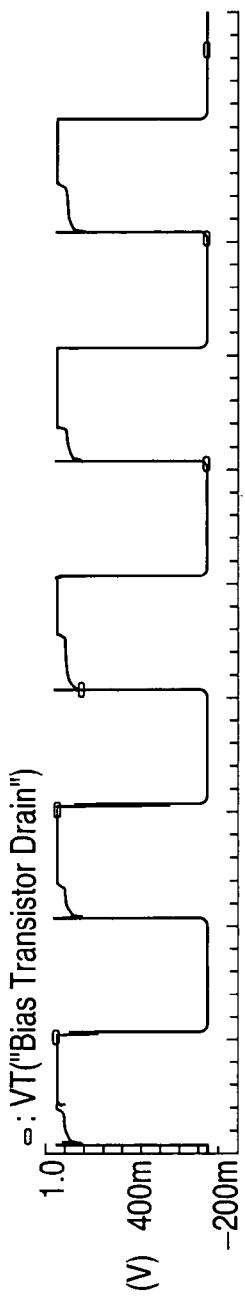
Figure 3D:
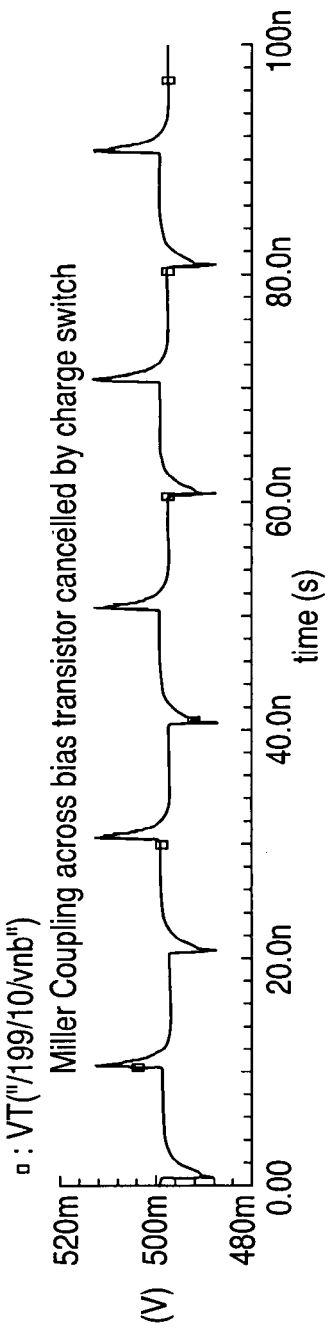

The first timing diagram shown in FIG. 3A shows the voltage (designated VT ("/P1_IDLE")) of enable signal P1_IDLE_EN as a function of time. The second timing diagram shown in FIG. 3B shows an inverted value of the enable signal voltage (designated VT ("/P0_ACTIVE")) as a function of time. The third timing diagram shown in FIG. 3C shows the voltage (designated VT ("Bias Transistor Drain")) of the drain node of bias transistor 150 as a function of time. The fourth timing diagram shown in FIG. 3D shows the bias control voltage VNB as a function of time (designated VT ("/I99/I0/vnb")). The fourth timing diagram shown in FIG. 3D shows the effect of canceling the voltage due to the Miller capacitance coupling across bias resistor 150.

Figure 4A:
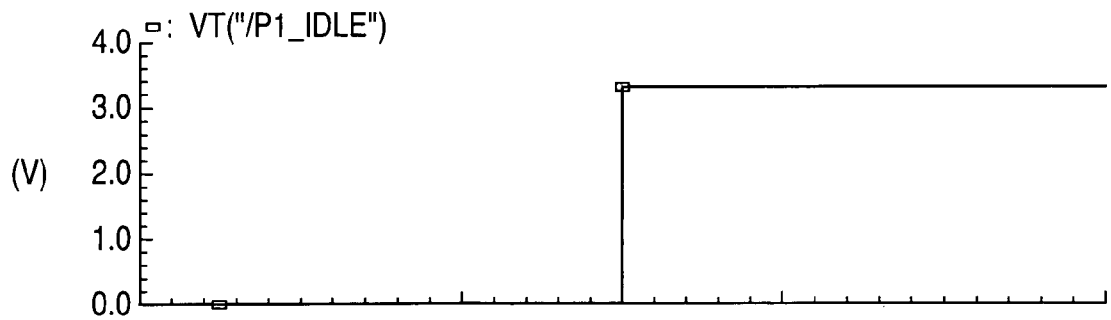
FIGS. 4A through 4C illustrates three timing diagrams that show a comparison of the active/idle state transition effects on the bias control voltage of a current mode logic (CML) transmitter output circuit with and without the operation of the fast turn on bias circuit of the present invention.
Figure 4B:
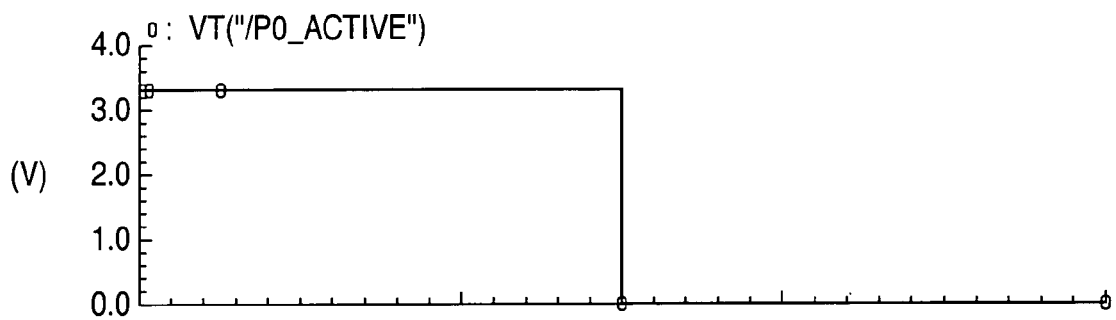
Figure 4C:
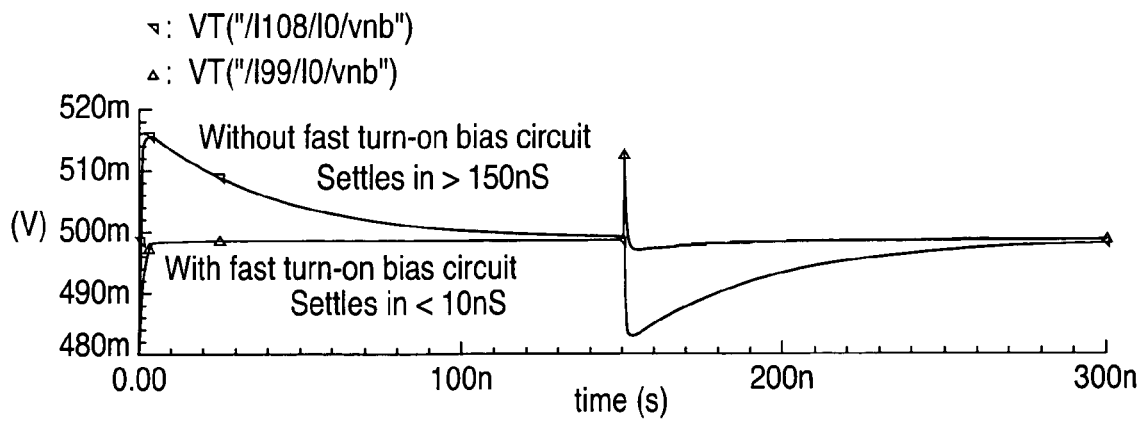

FIGS. 4A through 4C illustrates three timing diagrams that show a comparison of the active/idle state transition effects on the bias control voltage VNB of the current mode logic (CML) transmitter output circuit 100 with and without the operation of the fast turn on bias circuit 200. The three timing diagrams are from a computer simulation of the operation of current mode logic (CML) transmitter output circuit 100 and fast turn on bias circuit 200.

The first timing diagram shown in FIG. 4A shows the voltage (designated VT ("/P1_IDLE") of enable signal P1_IDLE_EN as a function of time. The second timing diagram shown in FIG. 4B shows an inverted value of the enable signal voltage (designated VT ("/P0_ACTIVE") as a function of time.

The third timing diagram shown in FIG. 4C shows the value of bias control voltage VNB as a function of time (designated VT ("/I108/I0/vnb") without the operation of the fast turn on bias circuit 200. Without the operation of the fast turn on bias circuit 200 the bias control voltage VNB takes more than one hundred fifty nanoseconds (150 ns) to settle to its steady state value.

The third timing diagram shown in FIG. 4C also shows the value of bias control voltage VNB as a function of time (designated VT ("/I99/I0/vnb") with the operation of the fast turn on bias circuit 200 as a function of time. With the operation of the fast turn on bias circuit 200 the bias control voltage VNB settles to its steady state value in less than ten nanoseconds (10 ns).

The fast turn on bias circuit 200 of the present invention capacitatively compensates the bias transistor 150 so that the state transitions have little effect on the bias voltage. The fast turn on bias circuit 200 allows the common mode logic (CML) transmitter output circuit 100 to be reactivated and the retransmission of data to be started after ten nanoseconds (10 ns) have elapsed.

Figure 5A:
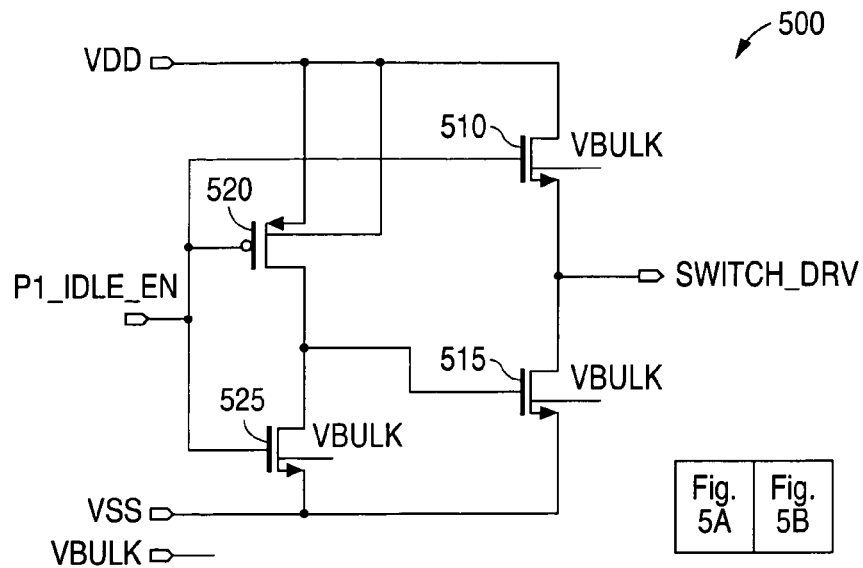
FIG. 5A illustrates a schematic diagram of a charge switch circuit for a fast turn on bias circuit of the present invention.
Figure 5B:
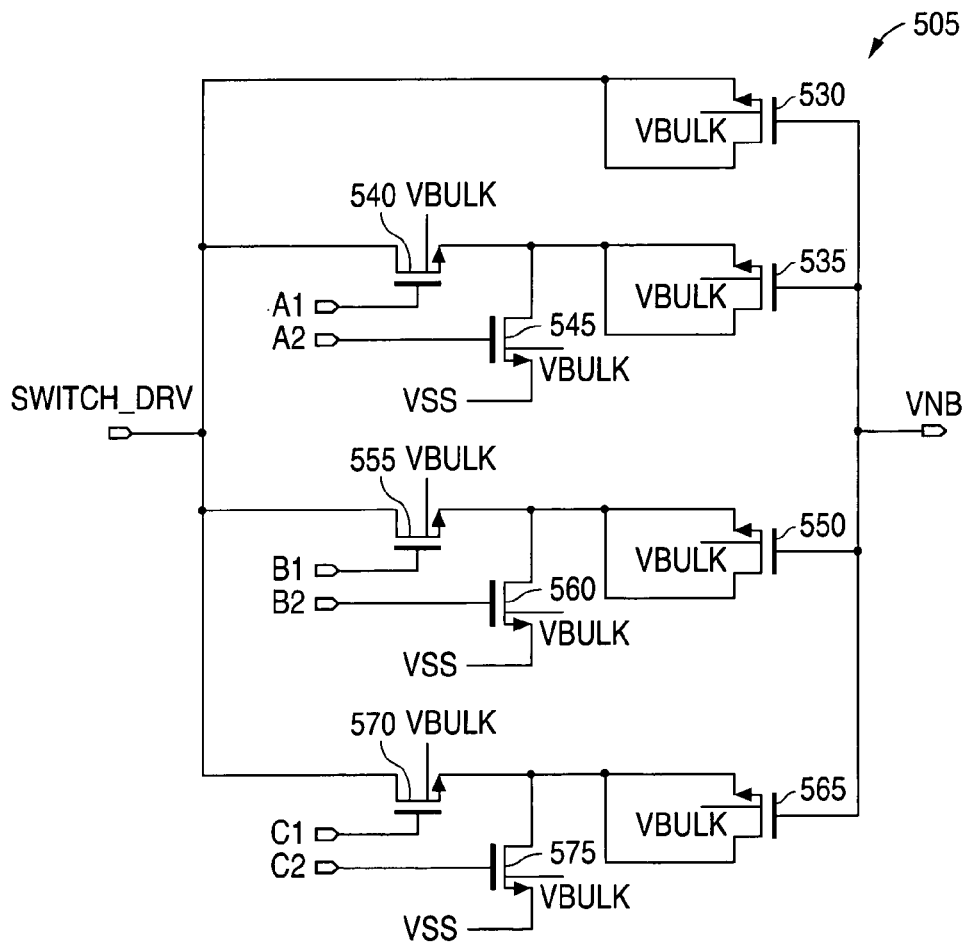
FIG. 5B illustrates a schematic diagram of a plurality of different size capacitors for use with the charge switch circuit shown in FIG. 5A.

FIG. 5A illustrates a schematic diagram of a charge switch circuit 500 of a fast turn on bias circuit of the present invention. FIG. 5B illustrates a schematic diagram of a circuit 505 comprising a plurality of different size capacitors for use with the charge switch circuit 500 shown in FIG. 5A. An output signal from charge switch circuit 500 in FIG. 5A entitled SWITCH_DRV is provided as an input to the circuit 505 shown in FIG. 5B.

The charge switch circuit 500 of FIG. 5A and the circuit 505 of FIG. 5B together comprise a fast turn on bias circuit (500, 505) of the present invention. This embodiment of the fast turn on bias circuit (500, 505) is capable of switching in or switching out different sized capacitors depending upon the output mode or drive level required by a particular application in a common mode logic (CML) transmitter output circuit.

Charge switch circuit 500 is identical in structure and operation to the charge switch circuit previously described with reference to FIG. 2. Specifically, the transistors 510, 515, 520 and 525 of charge switch 500 operate in the same manner as the transistors 220, 230, 240 and 250 of the charge switch circuit shown in FIG. 2.

The charge compensation capacitor 530 shown in FIG. 5B is also identical in structure and operation to the charge compensation capacitor 210 shown in FIG. 2.

FIG. 5B also shows three charge compensation capacitors in addition to charge compensation capacitor 530. The three additional charge compensation capacitors are charge compensation capacitor 535, charge compensation capacitor 550, and charge compensation capacitor 565. Each of the four charge compensation capacitors (530, 535, 550, 565) shown in FIG. 5B has a different value of capacitance.

Transistor 540 and transistor 545 are coupled to charge compensation capacitor 535. A first signal line designated A1 is coupled to the gate of transistor 540. A second signal line designated A2 is coupled to the gate of transistor 545. A user of the fast turn on bias circuit (500, 505) sends signals over the first signal line A1 to control the operation of transistor 540 and sends signals over the second signal line A2 to control the operation of transistor 545. In this manner a user can switch in or switch out charge compensation capacitor 535.

Similarly, transistor 555 and transistor 560 are coupled to charge compensation capacitor 550. A third signal line designated B1 is coupled to the gate of transistor 555. A fourth signal line designated B2 is coupled to the gate of transistor 560. A user of the fast turn on bias circuit (500, 505) sends signals over the third signal line B1 to control the operation of transistor 555 and sends signals over the fourth signal line B2 to control the operation of transistor 560. In this manner a user can switch in or switch out charge compensation capacitor 550.

Lastly, transistor 570 and transistor 575 are coupled to charge compensation capacitor 565. A fifth signal line designated C1 is coupled to the gate of transistor 570. A sixth signal line designated C2 is coupled to the gate of transistor 575. A user of the fast turn on bias circuit (500, 505) sends signals over the fifth signal line C1 to control the operation of transistor 570 and sends signals over the sixth signal line C2 to control the operation of transistor 575. In this manner a user can switch in or switch out charge compensation capacitor 565.

The advantageous embodiment of fast turn on bias circuit shown in FIG. 5A and in FIG. 5B is capable of generating a plurality of capacitance values for offsetting the Miller capacitance in the bias transistor 150 of a common mode logic (CML) transmitter output circuit. By switching in or switching out the three additional charge compensation capacitors (535, 550, 565) a user can select one of a plurality of values for the resultant charge compensation capacitance to be provided to the bias transistor 150.

Figure 6:
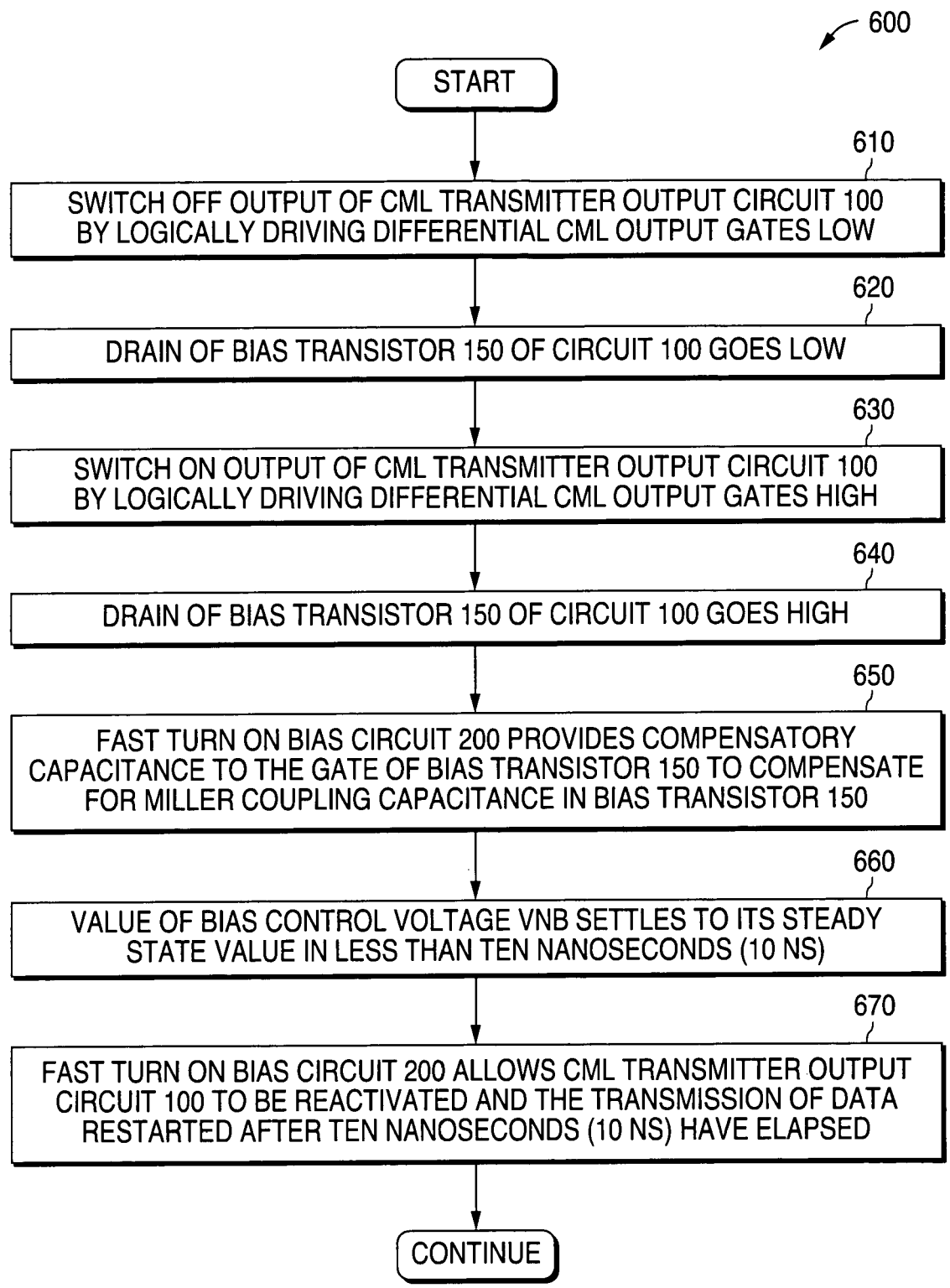
FIG. 6 illustrates a flow chart showing the steps of an advantageous embodiment of the method of the present invention.

FIG. 6 illustrates a flow chart 600 showing the steps of an advantageous embodiment of the method of the present invention. First the common mode logic (CML) transmitter output circuit 100 is switched off by logically driving the differential CML output gates low (step 610). Then the bias transistor 150 of the CML transmitter output circuit 100 goes low (step 620). Then the common mode logic (CML) transmitter output circuit 100 is switched on by logically driving the differential CML output gates high (step 630). Then the bias transistor 150 of the CML transmitter output circuit 100 goes high (step 640).

Then fast turn on bias circuit 200 provides compensatory capacitance to the gate of bias transistor 150 to compensate for the Miller coupling capacitance in bias transistor 150 (step 650). Then the value of bias control voltage VNB settles to its steady state value in less than ten nanoseconds (10 ns) (step 660). Then the fast turn on bias circuit 200 allows the common mode logic (CML) transmitter output circuit 100 to be reactivated and restart the transmission of data after ten nanoseconds (10 ns) have elapsed (step 670).

Although the present invention has been described with an exemplary embodiment, various changes and modifications may be suggested to one skilled in the art. It is intended that the present invention encompass such changes and modifications as fall within the scope of the appended claims.

What is claimed is:

1. A fast turn on bias circuit capable of being coupled to a gate of a bias transistor, said fast turn on bias circuit capable of providing a value of capacitance to said gate of said bias transistor to compensate for a Miller coupling capacitance in said bias transistor, said fast turn on bias circuit comprising:
a capacitor having an output capable of being coupled to said gate of said bias transistor; and
a charge switch circuit coupled to an input of said capacitor.

2. The fast turn on bias circuit as set forth in claim 1 wherein said capacitor comprises a transistor configured as a capacitor.

3. The fast turn on bias circuit as set forth in claim 1 wherein said capacitor has a value of capacitance that is equal in magnitude and opposite in sign to said Miller coupling capacitance in said bias transistor.

4. The fast turn on bias circuit as set forth in claim 3 wherein said charge switch circuit in response to control signals one of: enables an operation of said capacitor and disables an operation of said capacitor.

5. The fast turn on bias circuit as set forth in claim 4 wherein said charge switch circuit comprises:
a first transistor having an output coupled to an input of said capacitor and having a gate coupled to a first input control signal; and
a second transistor having an output coupled to said input of said capacitor and having a gate coupled to a second input control signal;
wherein said second input control signal is an inverted version of said first input control signal.

6. The fast turn on bias circuit as set forth in claim 5 wherein said charge switch circuit further comprises:
a third transistor and a fourth transistor coupled together in the form of an inverter circuit, said inverter circuit having as an input said first input control signal and having as an output said second input control signal;
wherein said output of said inverter circuit is coupled to said gate of said second transistor.

7. The fast turn on bias circuit as set forth in claim 4 wherein said charge switch circuit receives a control signal to enable an operation of said capacitor when a drain voltage of said bias transistor is increasing.

8. The fast turn on bias circuit as set forth in claim 4 wherein said charge switch circuit receives a control signal to disable an operation of said capacitor when a drain voltage of said bias transistor is decreasing.

9. The fast turn on bias circuit as set forth in claim 3 wherein said capacitor provides a value of capacitance to said bias transistor to compensate for said Miller coupling capacitance in said bias transistor in less than ten nanoseconds.

10. A common mode logic (CML) transmitter output circuit comprising a bias transistor and a fast turn on bias circuit capable of being coupled to a gate of said bias transistor, said fast turn on bias circuit capable of providing a value of capacitance to said gate of said bias transistor to compensate for a Miller coupling capacitance in said bias transistor, said fast turn on bias circuit comprising:
a capacitor having an output capable of being coupled to said gate of said bias transistor; and
a charge switch circuit coupled to an input of said capacitor.

11. The common mode logic (CML) transmitter output circuit as set forth in claim 10 wherein said capacitor of said fast turn on bias circuit comprises a transistor configured as a capacitor.

12. The common mode logic (CML) transmitter output circuit as set forth in claim 10 wherein said capacitor of said fast turn on bias circuit has a value of capacitance that is equal in magnitude and opposite in sign to said Miller coupling capacitance in said bias transistor.

13. The common mode logic (CML) transmitter output circuit as set forth in claim 12 wherein said charge switch circuit of said fast turn on bias circuit in response to control signals one of: enables an operation of said capacitor and disables an operation of said capacitor.

14. The common mode logic (CML) transmitter output circuit as set forth in claim 13 wherein said charge switch circuit of said fast turn on bias circuit comprises:

a first transistor having an output coupled to an input of said capacitor and having a gate coupled to a first input control signal; and a second transistor having an output coupled to said input of said capacitor and having a gate coupled to a second input control signal;

wherein said second input control signal is an inverted version of said first input control signal.

15. The common mode logic (CML) transmitter output circuit as set forth in claim 14 wherein said charge switch circuit of said fast turn on bias circuit further comprises:

a third transistor and a fourth transistor coupled together in the form of an inverter circuit, said inverter circuit having as an input said first input control signal and having as an output said second input control signal;

wherein said output of said inverter circuit is coupled to said gate of said second transistor.

16. The common mode logic (CML) transmitter output circuit as set forth in claim 13 wherein said charge switch circuit of said fast turn on bias circuit receives a control signal to enable an operation of said capacitor when a drain voltage of said bias transistor is increasing.

17. The common mode logic (CML) transmitter output circuit as set forth in claim 13 wherein said charge switch circuit of said fast turn on bias circuit receives a control signal to disable an operation of said capacitor when a drain voltage of said bias transistor is decreasing.

18. The common mode logic (CML) transmitter output circuit as set forth in claim 12 wherein said capacitor of said fast turn on bias circuit provides a value of capacitance to said bias transistor to compensate for said Miller coupling capacitance in said bias transistor in less than ten nanoseconds.

19. A fast turn on bias circuit capable of being coupled to a gate of a bias transistor, said fast turn on bias circuit capable of providing a plurality of values of capacitance to said gate of said bias transistor to compensate for a Miller coupling capacitance in said bias transistor, said fast turn on bias circuit comprising:

a plurality of capacitors of different values, each of said plurality of capacitors having an output capable of being coupled to said gate of said bias transistor; and a charge switch circuit coupled to an input of each of said plurality of capacitors.

20. The fast turn on bias circuit as set forth in claim 19 wherein each of said plurality of capacitors comprises a transitory configured as a capacitor.

21. The fast turn on bias circuit as set forth in claim 19 wherein a plurality of said capacitors have a combined value of capacitance that is equal in magnitude and opposite in sign to said Miller coupling capacitance in said bias transistor.

22. The fast turn on bias circuit as set forth in claim 21 wherein said charge switch circuit in response to control signals enables an operation of a first portion of said plurality of capacitors and disables an operation of a second portion of said plurality of capacitors.

23. The fast turn on bias circuit as set forth in claim 19 wherein said bias transistor is a bias transistor in a common mode logic (CML) transmitter output circuit.

24. The fast turn on bias circuit as set forth in claim 23 wherein said fast turn on bias circuit provides a value of capacitance to said bias transistor of said common mode logic (CML) transmitter output circuit to compensate for said Miller coupling capacitance in said bias transistor in less than ten nanoseconds.

\* \* \* \* \*